United States Patent [19]

Hager

[11] Patent Number: 4,706,604
[45] Date of Patent: Nov. 17, 1987

[54] WIPE-OFF APPARATUS OF LIQUID PHASE EPITAXY OF MERCURY CADMIUM TELLURIDE

[75] Inventor: Robert J. Hager, Minneapolis, Minn.

[73] Assignee: Honeywell Inc., Minneapolis, Minn.

[21] Appl. No.: 872,321

[22] Filed: Jun. 9, 1986

[51] Int. Cl.$^4$ .......................................... H01L 21/208
[52] U.S. Cl. ..................................... 118/415; 118/421
[58] Field of Search ........................ 156/621, 622, 624; 118/412, 415, 421; 148/171

[56] References Cited

U.S. PATENT DOCUMENTS

| | | | |
|---|---|---|---|
| 3,747,562 | 7/1973 | Stone et al. | 118/415 |
| 3,890,194 | 6/1975 | Ettenberg | 156/622 |
| 4,317,689 | 3/1982 | Bowers et al. | 148/171 |
| 4,366,771 | 1/1981 | Bowers et al. | 118/415 |
| 4,592,304 | 6/1986 | Hager et al. | 118/415 |

FOREIGN PATENT DOCUMENTS 54-7861  1/1979  Japan .................................. 156/624

Primary Examiner—John P. McIntosh
Attorney, Agent, or Firm—Omund R. Dahle

[57] ABSTRACT

In a covered graphite slider apparatus for the liquid phase epitaxial growth of mercury cadmium telluride, this invention shows the addition of an improved wipe-off arrangement positioned in tandem with the CdTe substrate upon which the HgCdTe epitaxial layer is grown. This arrangement includes the providing of a discardable CdTe drainage apron adjacent the substrate for preventing residual growth solution from migrating back onto the substrate which has just been wiped-off by the LPE slider.

1 Claim, 3 Drawing Figures

WIPE-OFF APPARATUS OF LIQUID PHASE EPITAXY OF MERCURY CADMIUM TELLURIDE

BACKGROUND AND SUMMARY OF THE INVENTION

The U.S. Government has rights in this invention pursuant to a contract F33615-85-C-5057 awarded by the Department of Air Force.

The subject matter of this invention generally relates to the field of slider apparatus used for the liquid phase epitaxial growth of $(Hg_{1-x}Cd_x)Te$ films.

The prior art such as U.S. Pat. Nos. 4,317,689 or 4,366,771 (both assigned to the same assignee as the present application) teaches a representative covered graphite slider system for LPE growth of HgCdTe. $Hg_{1-x}Cd_xTe$ is an important semiconductor for use in photovoltaic and photoconductive infrared photon detectors. $Hg_{1-x}Cd_xTe$ can be grown by liquid phase epitaxy at atmospheric pressure from a Te-rich solution in which case the Hg vapor pressure is below 0.1 atm at 500° C. This low vapor pressure makes possible the use of open-tube, slider growth techniques. The teachings of these patents is incorporated by reference.

In FIG. 1, one of the figures is reproduced from the prior art patent referenced above. A quartz tube 10, of which a partial section is shown, provides the conventional furnace enclosure within which the $Hg_{1-x}Cd_xTe$ is grown. A suitable source of heat, such as a heating coil 11 around the tube, provides the desired temperature for the liquid phase epitaxy growth of $Hg_{1-x}Cd_xTe$. The graphite furnace boat comprises a slider of carrier section 12, a base section 13, and a cover section 14. The slider section 12 has one or more wells 15 extending through the section, and has a more shallow well or depression 16. The bottom surface of the slider section 12 has a continuous trough or groove 17 therein looping around the bottom near the perimeter. A channel extending in a vertical direction through the slider section connects the groove 17 to the top surface. The well 15 is adated to contain a growth solution 20 of $(Hg_{1-x}Cd_x)_{1-y}Te_y$. A plug 21 caps the well. The base section 13 of the boat has a recess 22 in the top surface thereof. The purpose of the recess is to receive a growth substrate, such as CdTe, upon which the LPE layer of $Hg_{1-x}Cd_xTe$ is epitaxially grown. The cover section 14 of the boat has a shoulder 25 on its lower face and extending around its perimeter which is machined to fit closely to the upper surface of the slider section 12.

When growing $Hg_{1-x}Cd_xTe$ in the apparatus of FIG. 1, a growth substrate is placed in the recess 22. A charge 20 of $(Hg_{1-x}Cd_x)_{1-x}Te_y$ is placed in the well 15 and the well capped with plug 21. It is necessary to prevent loss of Hg from the charge 20 during the growth procedure. A Hg source wafer 26 of HgTe plus Te is placed in shallow well 16. The cover 14 is placed over the slider 12 and the furnace boat is placed in the tube 10, is purged, and is heated to 500° C. A source of $H_2$ gas is caused to flow in the quartz tube. When equilibration is reached, the slider is moved with respect to the base to position the well 15 with $(Hg_{1-x}Cd_x)_{1-y}Te_y$ charge 20 over the substrate in recess 22 so that the epitaxial growth can commence. The purpose of the wafer 26 is to give up Hg thereby pressurizing the growth area, i.e., the region 27 under the cover 14, in the wells 15 of the slider and in the groove or moat 17 around the bottom of the slider. Since this is a slider assembly, some Hg vapor leaks and diffuses out of the boat through the cover fit or through the sliding fit between slider section 12 and base section 13 and into the $H_2$ gas stream contained in the quartz tube 10. The Hg which escapes is replaced by dissociation of the source wafer 26 to thereby maintain a constant Hg pressure over the plug 21, and around the growth solution 20 and growth substrate. Since the partial pressure of Hg from the source wafer 26 of HgTe is the same as the partial pressure of Hg from the charge 20, i.e. about 0.1 atm, there is prevented any loss of Hg from the charge 20 and the LPE grown layer of $Hg_{1-x}Cd_xTe$ on the substrate. The apparatus of FIG. 1 establishes the environment in which the improvement of the present invention is useful.

One limitation of the prior art is that it has previously been impossible to wipe the last drop of growth solution from the substrate. Some remnant or residual of the growth solution tends to adhere to the surface of the HgCdTe epilayer after growth in the slider apparatus. For example, after the slider has moved to a point where the cooling well is over the epilayer, the residual growth solution film under the slider may migrate back onto the newly grown HgCdTe epitaxial film which has just been wiped off by the LPE slider. In the cooling well this unwanted growth solution will harden across a portion of the surface of the epilayer thus reducing the yield. The present invention is an improvement over the prior art in the use of improved wipe-off apparatus in the slider structure to assist wipe-off of HgCdTe and prevention of reverse migration of unwanted film onto the epilayer following LPE growth. The improved apparatus described herein comprises a scribed CdTe drainage apron for preventing the HgCdTe growth from migrating back onto substrates which have just been wiped-off by the LPE slider.

DESCRIPTION

Figure 1:
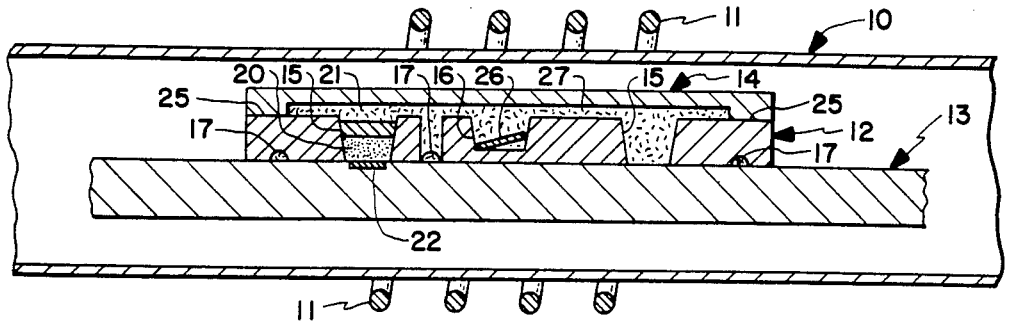
FIG. 1 is an example of the prior art liquid phase epitaxial slider apparatus.
Figure 2:
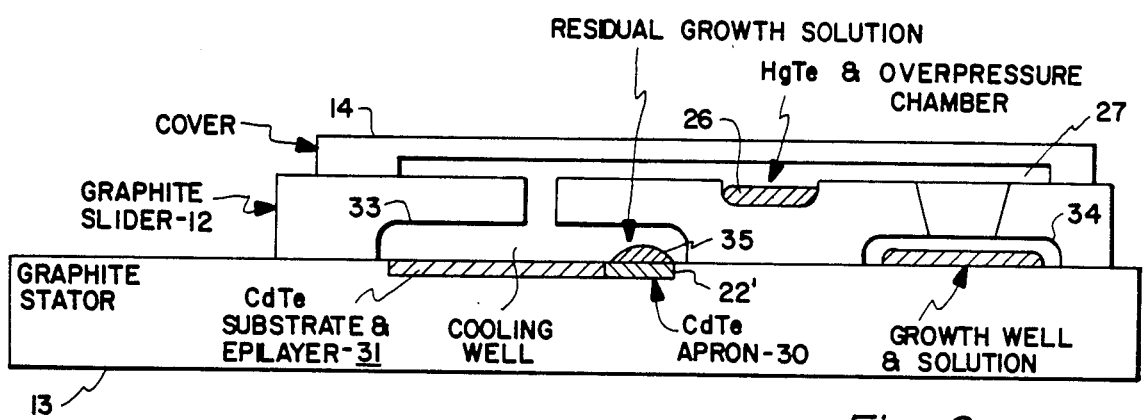
FIG. 2 discloses the improved wipe-off apparatus.
Figure 3:
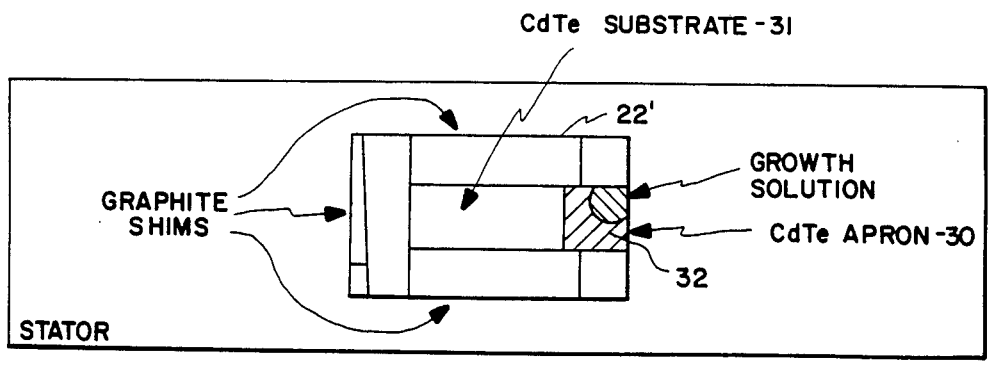
FIG. 3 is a top view of the stator and scribed apron.

Referring now to FIGS. 2 and 3 there is again shown a graphite base section or stator 13, a slider section 12 and a cover section 14. The base section 13 has a recess 22' in the top surface which is somewhat larger than the recess 22 of FIG. 1 in order to accomodate a discardable CdTe apron 30 as well as the CdTe substrate 31 in the recess. It may also be advantageous to surround the substrate and apron with graphite shims as shown in FIG. 3 for reasons of removal of the substrate and epilayer from the base section. The wipe-off apron 30 is placed in tandem with the substrate 31 in the recess 22'. Apron 30 may be either polycrystalline CdTe or single crystalline of any orientation, that incorporates diagonal scribe marks 32 on its exposed surface. The scribe marks may be made on the apron with a diamond scribe as shown in FIG. 3.

Referring again to FIG. 2, the slider is shown in its cooling position with the cooling well 33 located over the newly grown epilayer 31 and apron 30. During previous growth of the epitaxial layer, the growth well 34 and growth solution had been positioned over the substrate 31 and over at least a portion of the CdTe apron 30 adjacent to the substrate. A layer grows on the apron as well as on the substrate. After the growth process ends, the slider 12 begins to move past the epilayer. As the growth well 34 moves beyond the epilayer, the growth solution moves with the slider. A residual film of growth solution will be trapped between the surface of the base and the following edge of the growth well. The slider has to float a finite distance above the surface of the epilayer or else the HgCdTe could be scratched. This finite distance between the sliders lower edge and the subjacent surface allows the residual film to remain. After the slider recedes to a position where the cooling well is over the epilayer as in FIG. 2, the residual growth solution creeps back toward the apron and epilayer and tends to reform into a drop 35. This invention provides a place for the residual growth solution drop 35 to remain without getting onto the grown epitaxial film. The apron is also grown on and during the slide-off actually induces the last drop of growth solution off the epilayer because of the diagonal scribe marks which create a rough surface with a direction vector. The result is 100% wipe-off. With the last drop of growth solution removed from the grown epilayer the yield of viable material increases and epilayer processing is reduced because the epilayers are a standard size without the need of removing a drop of growth solution.

Referring again to the function of the scribed apron 30, after the epitaxial growth has been completed and the slider is repositioning to slide off the growth well and solution, the residual growth solution will be pulled to the forward edge of the apron by the slider. When the edge of the cooling well comes over the epilayer and apron, the residual growth would have to recede back past the apron to reach the epilayer. Spreading back to the epilayer is prevented by the scribes in the apron and surface tension adhesion. Consequently, once the cooling well comes over the epilayer area the residual growth solution will recede and harden on the apron. After cooldown, the CdTe apron can be discarded as waste.

The embodiments of the invention in which an exclusive property or right is claimed are defined as follows:

1. Apparatus for improved wipe-off of residual LPE growth solution from a newly grown epitaxial layer of HgCdTe in a slider furnace boat apparatus, comprising:

a slider type graphite boat for use in a liquid phase epitaxy growth furnace, which boat includes a base member and a slider member;

an elongated recess in said base member sized to receive in tandem a CdTe substrate and a CdTe apron which apron has a scribed surface;

a CdTe substrate and a discardable CdTe apron in tandem in said recess, said CdTe apron having a plurality of diagonal scribe marks on its scribed surface;

said slider member having a planar lower face adapted to mate with and be slideable along said base member top face, said slider member having a first growth well extending therethrough from a top surface to the lower face for receiving and holding a growth solution of $(Hg_{1-x}Cd_x)_{1-y}Te_y$, said first well being slideable over said recess for epitaxial growth on said substrate and scribed apron, said slider member also having a cooling well extending therethrough from the top surface to the lower face and positioned in said slider member so that as the slider member is moved along the base to remove the growth well and growth solution first from the substrate and next from the scribed apron, the cooling well then comes into position over said recess, and any remnant solution attempting to migrate back towards the substrate with its newly grown epilayer is contained by the scribed apron.

* * * * *